US005723868A

United States Patent [19]
Hammond, Jr. et al.

[11] Patent Number: 5,723,868
[45] Date of Patent: Mar. 3, 1998

[54] ILLUMINATING ASSEMBLY FOR USE WITH BAR CODE READERS

[75] Inventors: Charles M. Hammond, Jr.; William H. Havens, both of Skaneateles, N.Y.

[73] Assignee: Welch Allyn, Inc., Skaneateles Falls, N.Y.

[21] Appl. No.: 805,739

[22] Filed: Feb. 25, 1997

Related U.S. Application Data

[63] Continuation of Ser. No. 441,037, May 15, 1995, abandoned.
[51] Int. Cl.$^6$ ............................................. H01L 31/14
[52] U.S. Cl. .................... 250/553; 250/578.1; 362/16; 235/473
[58] Field of Search ................................... 250/553, 239, 250/221, 208.1, 208.2, 227.11, 216, 226, 227.22, 578.1; 362/16, 30, 277–283, 800; 235/473, 472, 462, 454

[56] References Cited

U.S. PATENT DOCUMENTS

| | | | |
|---|---|---|---|
| 3,842,263 | 10/1974 | Kornrumpf et al. | 250/239 |
| 4,005,286 | 1/1977 | Faulkner | 250/239 |
| 4,354,106 | 10/1982 | Walter | 250/239 |
| 4,963,933 | 10/1990 | Brownlee | 250/553 |
| 5,313,373 | 5/1994 | Bjorner et al. | 362/19 |
| 5,378,883 | 1/1995 | Batterman et al. | 235/472 |
| 5,504,367 | 4/1996 | Arackellian et al. | 235/472 |
| 5,521,366 | 5/1996 | Wang et al. | 235/454 |

FOREIGN PATENT DOCUMENTS 9304442 of 1993 WIPO.
9419766 of 1994 WIPO.

*Primary Examiner*—Que Le
*Attorney, Agent, or Firm*—Wall Marjama & Bilinski

[57] ABSTRACT

An array of reflectors is arranged to approximately match the arrangement of a two-dimensional array of LEDs such as used in a 2-D bar code scanner. Each reflector has at least one reflecting wall for reflecting light from a respective LED, thus increasing the amount of LED light illuminating the target.

20 Claims, 3 Drawing Sheets ns. These LEDs produce a very smooth distribution of illumination within the field of view because the radiation pattern is very broad, and because no image of the LED structure is formed close to the target.

ILLUMINATING ASSEMBLY FOR USE WITH BAR CODE READERS

This is a Continuation of application Ser. No. 08/441,037 filed May 15, 1995, now abandoned.

FIELD OF THE INVENTION

This invention relates to illumination systems for optical readers such as bar code scanners, and more particularly to an apparatus and method to improving LED illuminating efficiency for 2-D bar code scanners.

BACKGROUND AND SUMMARY OF THE INVENTION

Bar code scanners, both 1-D (for scanning one-dimensional codes) and 2-D (for scanning two-dimensional codes), work by projecting an optical image of the bar code symbol onto a photodetector, which produces an electrical signal that is proportional to the amount of light that is reflected from the symbol. In order to function properly it is necessary to produce an acceptable signal to noise ratio, a signal that does not vary excessively with symbol position, and a signal that is an accurate electrical analog of the symbol reflectivity. These conditions can be achieved by providing sufficient illumination that is properly distributed within the scanner field of view and which is smooth and free from structure. Hand held bar code scanners usually have severe spatial constraints which restrict the light source design to small, simple structures. The illumination source in most hand held bar code scanners is an integral part of the product and is usually much smaller than the spatial volume that it is required to illuminate. For use in a commercially successful product it is also required that the illumination source be efficient, easy to produce, and inexpensive. A photodetector is also generally an integral part of the product. The photodetector lens and the light source are generally placed close together, with respective optical axes as close to coincident as possible, defining a "system optical axis."

Red LEDs that radiate at 660 nm are often used in bar code scanners because they are an efficient, rugged source of light that is close to the 632nm He—Ne wavelength specified for use with most bar code labels. Such LEDs are commonly available in inexpensive epoxy packages that not only protect the LED die but which are shaped so as to form a lens that collects a relatively large portion of the light that is produced and projects it in a generally directional beam of high luminous intensity. However, the location of the die relative to the lens is not accurately controlled and it is difficult to aim the LEDs well enough to produce a smooth, uniform distribution of illumination within the required field of view. This problem can be avoided by using LEDs that are contained within packages that have no lenses.

The flat top family of LEDs manufactured by SIEMENS and HEWLETT PACKARD are surface mount packages with a flat epoxy exit window rather than a lens. A relatively small amount of light exits from the top of the die and proceeds forward, unhindered, towards the target volume. The die is recessed into a diffusely scattering tub that is irradiated by a relatively large amount of light that exits from the sides of the die. The tub becomes a new, larger source of radiation by scattering light from the sides of the die forward towards the target volume. These two light components combine to form an effective light source that is larger than the LED die, and that has a Lambertian radiation pattern. The SIEMENS LHT-b 674, for example, is currently being used as a light source in commercial bar code scanners. These LEDs produce a very smooth distribution of illumination within the field of view because the radiation pattern is very broad, and because no image of the LED structure is formed close to the target.

However, the light is so very spread out that much of it misses the intended target region and the essentially Lambertian radiation pattern produces an electrical signal in the photodetector that varies, generally, as the cosine to the eighth power of the target angle away from the system optical axis. Clearly, a simple optical arrangement that can redirect the wasted light back into the target volume so as to increase the illumination efficiency would be useful. Also useful would be to redirect the wasted light in such a way as to provide a light intensity distribution that, as much as possible, renders the resulting electrical signal relatively independent of symbol position in the target plane. This can be accomplished by directing the light so as to produce a light intensity distribution that varies as the inverse of cosine to the forth power in a plane that is normal to the system optical axis and is at the distance of best focus.

As an example, the symbol or target field of view for one 2-D bar code scanner is a volume measuring 5.4"×4"×4", the center of which is located 8" away from the window of the scanner. The edges of this target volume subtend a nominal 22.8 degrees from the system optical axis, so that about 15% of the light from the LEDs is useful in illuminating bar code targets. In a sense, the light gathering capability of this volume is equivalent to the light gathering capability of an F#(F-number)/1.2 lens, which illustrates the need for light collection optics with large numerical aperture (NA).

This useful light is contained within a cone about the system optical axis and the same solid angle would be subtended by an ordinary F#/1.2 collection lens, with no increase in light intensity at the target. An ordinary collection lens could be made larger to collect a larger solid angle of the light output, but the required diameter of an ordinary "flat" lens would increase according to the tangent of the collection angle. This increases very rapidly as the collection angle increases, so that the required lens becomes prohibitively large at the NA required to produce a significant improvement in illumination. The target volume is too large to be adequately illuminated by a single LED; an array of LEDs is required. Spatial constraints require the LEDs to be relatively close together in order to provide an adequate number of them. Even so, a single light collector for an entire such array would be prohibitively large. Therefore the applicants considered using a plurality of smaller light collectors—one light collector for each LED.

The relatively large size of the diffusing reflector in the LED flat top package requires that a collection lens be spaced relatively far from the LED, which in turn requires that the lens diameter be large in order to collect more light. The required lens diameter is so large that it would overlap adjacent lenses unless the distance between LEDs were increased by decreasing the number of LEDs. Although special refracting arrangements can be conceived that could collect additional light, the design would require elements of large or complicated cross section that would be difficult to mold reliably in plastic. This problem is solved by using a curved mirror or reflector rather than a lens to collect the wasted light, while allowing the useful light to proceed forward, unhindered, to the target.

Reflectors have been used to increase the illumination efficiency in 1-D bar code scanners, where LEDs in a single line are usually used. In this case it is useful to use a single, essentially cylindrical, reflector to collect the light from a linear array of LEDs and project it to a line in the target plane. These solutions are not as useful for 2-D scanners because the light must illuminate a plane rather than a line, and a single reflector that can redirect the light from an array of the required number of LEDs would be unacceptably large even if the LEDs themselves were arranged in the smallest possible 2-D array.

Accordingly, one object of this invention for 2-D scanners is to use a reflecting light director that comprises a plurality of reflectors, each used in conjunction with a single corresponding LED package, in order to redirect into the bar code target volume some of the light that would otherwise fall outside the target volume, while allowing the light that already falls within the target volume to proceed uninhibited. An illustrative sketch of the invention, using a simple conical reflector, is shown in FIG. 1.

Another object of this invention is to allow construction of an embodiment of the reflecting light director that will distribute the redirected light in such a way as to minimize the variation of the resulting electrical signal as a function of symbol position within the target volume.

One advantage of the LED light director disclosed herein is achievement of higher light source efficiency than can be achieved with conventional refractive systems. Another advantage is that a reflector can be molded with no thick, difficult to fill elements (as lenses would be). Additionally, the system achieved thereby is very compact and the current required to operate the illumination system is reduced.

DETAILED DESCRIPTION OF THE DRAWING

Figure 1:
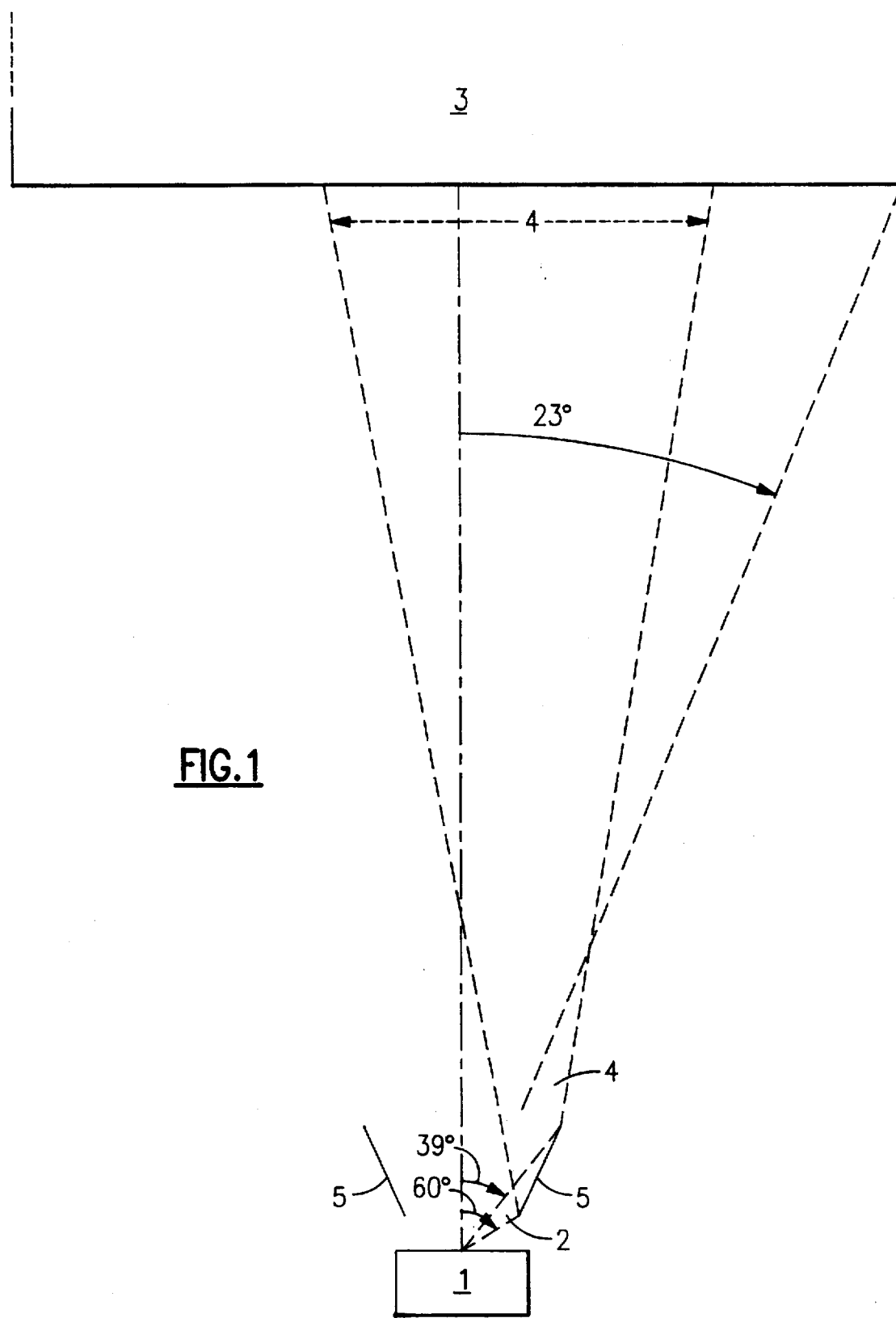
FIG. 1 is an illustrative sketch of reflective effect according to a first embodiment of the invention.
Figure 2:
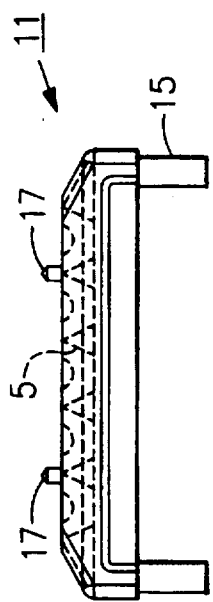
FIG. 2 is a bottom view of the light directing unit according to the first embodiment of the invention.
Figure 3:
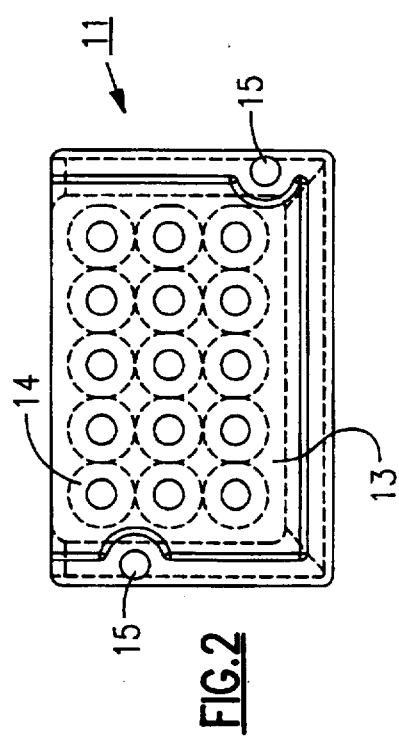
FIG. 3 is a side view of the light directing unit according to the first embodiment of the invention.

An example of how light from a single LED can be redirected according to the invention is illustrated in FIG. 1. Reflecting wall 5 is arranged around and extending forward of the light emitting LED package 1. Reflecting wall 5 intercepts light rays 2, which otherwise would be wasted because they would miss the target volume 3. These rays are redirected 4 into the target volume 3 where they produce useful illumination.

In the embodiment illustrated in FIG. 1 (not dram to scale) the reflecting wall 5 recovers light rays that lie from 39 to 60 degrees off-axis and that contain 35 percent of the light that is produced by the LED. Now, instead of only 15 percent of the LED light illuminating the target volume, the case without redirection, 50 percent of the total light reaches the target volume. This amounts to a three-fold increase in useful light and is equivalent to the light gathering power of an F#/0.5 lens.

Embodiments for practicing the invention are illustrated in FIGS. 2-5 of the drawing. The light directing unit 11 can be constructed in any number of ways known in the art, but in this embodiment is fabricated as an integral molded plastic matrix or array element. This element is then vacuum coated first with a chromium substrate layer, then an aluminum reflecting layer, and finally a silicon dioxide passivation layer. A diffusely scattering surface might also be useful for some applications, but this would not be quite as effective for the example 2-D bar code scanner discussed above.

The light directing unit 11 of the embodiment comprises a two-dimensional reflector array 13 of fifteen holes surrounded by respective conical reflecting walls 5. A 3×5 rectangular array is shown in the drawing, but other number, size, and shape arrays may be used. The arrays 13 of reflectors 14 may be rectangular, honeycomb shaped, or comprise other groupings, including even irregular groupings, depending on the size and shape of the corresponding LED array desired. A reflector 14 may comprise any number of reflecting walls arranged about an LED so as to reflect a portion of its light. In embodiment illustrated in FIGS. 2-4 each individual reflector 14 comprises a single continuous conical reflecting wall 5.

Figure 4:
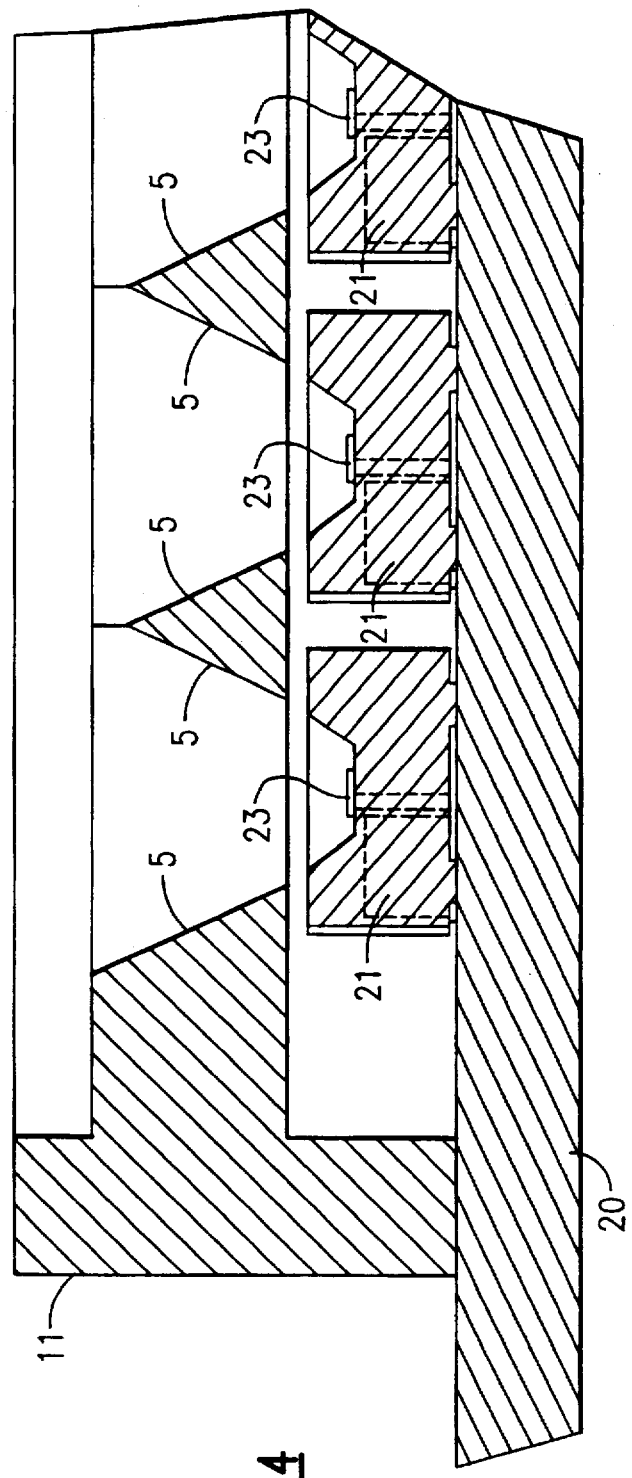
FIG. 4 is a partial side view of the light directing unit and LEDs as combined according to the fast embodiment of the invention.

LEDs are placed on a printed circuit board (PCB) 20 in an array corresponding to the array of reflectors comprised by the light directing unit 11. FIG. 4 depicts flat top package LEDs 21 being used. The light directing unit 11 is placed securely on the PCB so that each reflector 14 (labeled in FIG. 2) is positioned around a die 23 of a corresponding LED 21. The corresponding arrays of reflectors and LEDs may be made and positioned so that each LED is as close as possible to the axis of its corresponding reflector 14, with all reflectors 14 having axes parallel to one another (as in the preferred embodiments). Alternatively, light can be "smeared" around the target volume by positioning the LEDs with varying offsets (in varying directions) from respective reflector centers, or by varying the shapes and axis orientations of the various reflectors (or by a combination of these and/or other methods).

In the illustrated embodiment, the light directing unit 11 comprising the two-dimensional array of reflectors is placed closer to the target than is the two-dimensional array of LEDs, so that an air space is left between each LED and its corresponding reflector. In other embodiments of the invention the array of LEDs may be equidistant or closer to the target. Indeed, the light directing unit 11 can comprise the LEDs within it, with LEDs fixed inside corresponding reflectors. Reflectors and reflecting walls should preferably (but not necessarily) completely encircle the LED package axis.

In the illustrated embodiment, pins 15 are used to hold the light directing unit 11 on the PCB 20. The pins 15 are melted after sticking through the PCB (i.e., by heat stake). Pins 17 may be used for holding a diffusing unit (not shown) in place on the light directing unit 11. Such a diffusing unit can be a binary optic diffuser such as one of the Light Shaping Diffusers™ family manufactured by Physical Optics Corporation.

Light emitted from the LED dies 23 shines directly into the target volume 3, and also reflects off reflecting walls 5 to further illuminate the target volume.

As a preferred alternative to the single continuous conical reflecting wall 5 of FIGS. 1-4, FIG. 5 illustrates how, in addition to collecting more light, a reflecting wall 55 can be segmented and adjusted to distribute the redirected light rays such that light intensity in the target volume increases with distance away from the optical axis 10. The form of this distribution is chosen by design to compensate for optical and geometrical effects that would otherwise produce an electrical signal amplitude that varies as cosine to the eighth power in angle away from the system optical axis.

Figure 5:
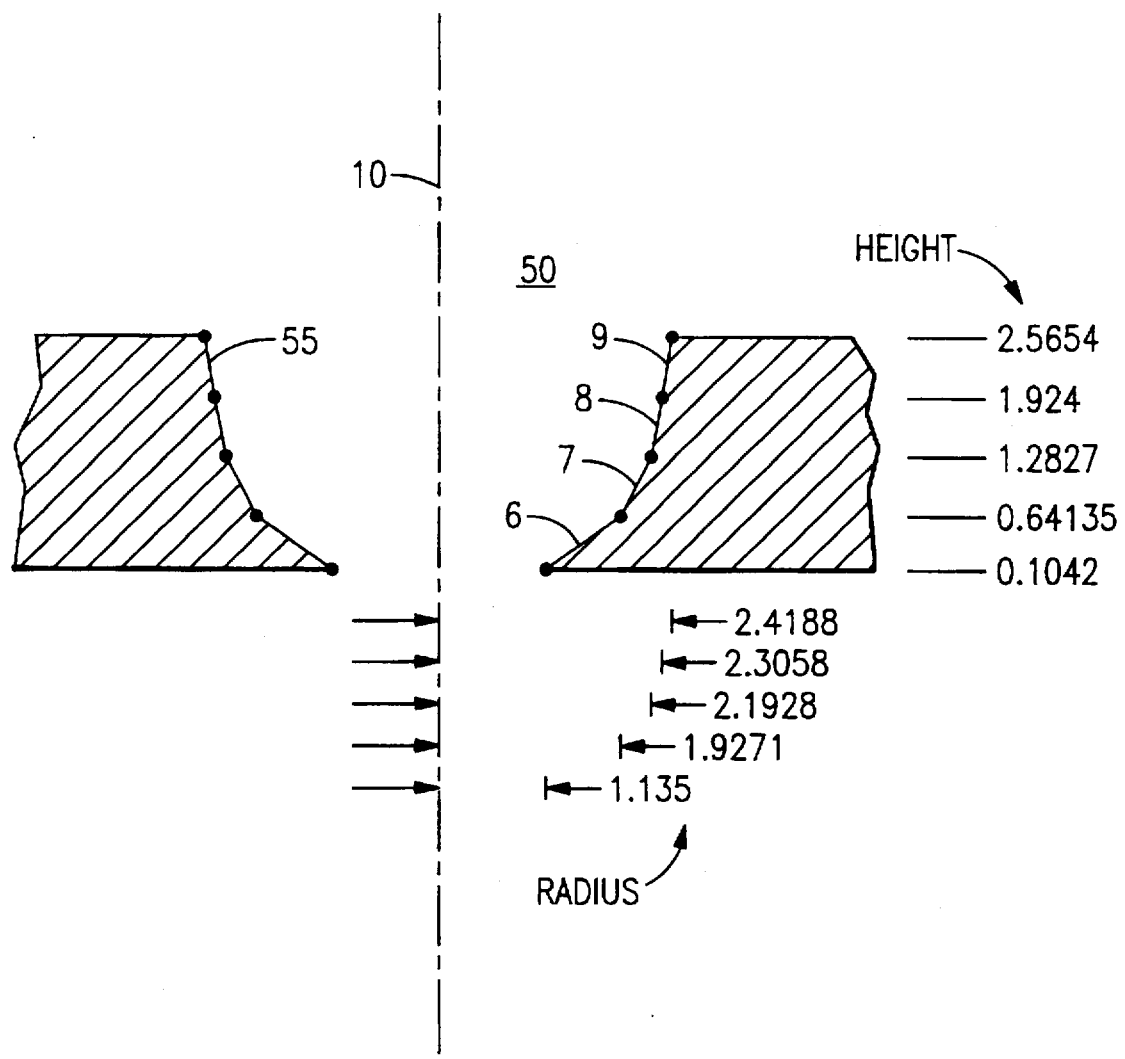
FIG. 5 is a cross-sectional view of a preferred shape for a reflecting wall according to a second embodiment of the invention.

The reflector 50 illustrated in FIG. 5 is designed to accomplish this effect. Given below are positions for top and bottom edges of reflecting wall segments 6, 7, 8, 9 using (x, y) coordinates to respectively represent radius and height above the top surface of the LED package.

| Segment 6 | (1.135, 0.1042) | to | (1.927, 0.64135) |
|---|---|---|---|
| Segment 7 | (1.927, 0.64135) | to | (2.1928, 1.2827) |
| Segment 8 | (2.1928, 1.2827) | to | (2.3058, 1.924) |
| Segment 9 | (2.3058, 1.924) | to | (2.4188, 2.5654) |

Better light distribution and greater collection efficiency may be obtained at higher cost by using more complex shapes, such as surfaces with smoothly varying curvature.

As used in the claims, "conical shape" includes any conic, frustoconic, or semi-conic shape, or section of a conic shape (e.g., a hollow frustum, a semi-cone, section of a multi-section conic reflector, etc.). "Redirection" of light means a change in the direction of a light ray before arriving at the target, by means of an encounter with a non-gaseous surface.

While the present invention has been particularly shown and described with reference to the embodiments illustrated in the drawing, one skilled in the art will understand that various changes in detail may be effected therein without departing from the spirit and scope of the invention as recited by the claims. Once the basic ideas and the examples given above are known, one skilled in the art will understand that simple calculation and/or experimentation will reveal any number of other embodiments of the invention to accomplish similar results.

We claim:

1. A light director for use with non-contact bar code symbol readers of the type including a two-dimensional array of light sources for illuminating a two-dimensional field of view, comprising:

a director body member including a two-dimensional array of light directing units, each of which directs light generated by a respective one of said light sources toward said two-dimensional field of view as a whole, each of said light directing units including:

(i) a first open end for receiving light generated by a corresponding light source located in proximity thereto;

(ii) a second open end through which light received into the corresponding first open end is able to pass out of said director; and (iii) a wall extending between said first and second open ends for increasing the fraction of light passing out of said second open end, wherein light passing from said second open end of each of said light directing units impinges in an overlapping manner onto said field of view as a whole, said illuminated field of view extending a predetermined distance from said light director.

2. The light director of claim 1, in which said two-dimensional array of light sources includes a generally planar array of LEDs, and in which said light directing units are arranged in proximity to said array of LEDs, such that most of the light emitted by the LEDs enter the first open ends of correspondingly arranged light directing units.

3. The light director of claim 2, wherein said light director is spaced a predetermined distance from said array of LEDs such that a gap is formed between the open first ends of said light directing units and said array of LEDs.

4. The light director of claim 1, wherein the predetermined light impinging distance between said light director and said two-dimensional field of view allows a typical bar code symbol to fit within said two-dimensional field of view.

5. The light director of claim 1, in which said director body member has a molded one-piece construction.

6. The light director of claim 1, in which said walls each include a plurality of wall segments having different angular orientations with respect to optical axes of corresponding light sources.

7. The light director of claim 6, in which at least one of said segments of each of said walls has an angular orientation causing said at least one wall segment to intercept light rays that are emitted at angles from about 39° to about 60° away from the optical axes of the corresponding light sources.

8. The light director of claim 6, in which at least one of the wall segments of each of said walls has an approximately conical shape.

9. The light director of claim 6, in which at least one of the wall segments of each of said walls includes a plurality of approximately planar wall segments.

10. The light director of claim 1, wherein the intensity of light impinging on an outer portion of said two-dimensional field of view from said light director units is greater than the intensity of light impinging on an inner portion of said field of view when said director is placed the predetermined distance from said field of view.

11. In an illuminating apparatus for use in illuminating the field of view of a non-contact bar code symbol reader,:

an array of LEDs;

a generally planar substrate for supporting said array of LEDs;

a light director member, positioned in proximity to said array, defining an plurality of light directing units, each of said light directing units having:

(i) a first open end for receiving light generated by a corresponding LED;

(ii) a second open end through which light received into the first corresponding open end is directed at said field of view;

(iii) a surface disposed between said first and second open ends for concentrating light received into said first open end wherein light directed at said field of view from said light directing units impinge thereon in an overlapping manner, said illuminated field of view extending a predetermined distance from said light detector; and means for attaching said light director member to said substrate so that most of the light emitted by each LED enters the first open end of the corresponding light directing unit.

12. The illuminating apparatus of claim 11, in which the reader is a two-dimensional bar code reader, in which said array of LEDs comprises a two-dimensional array of LEDs, and in which said field of view comprises a two-dimensional field of view.

13. The illuminating apparatus of claim 11, in which the first open ends of said light directing units are separated from said LEDs by a gap having a width selected so that relatively large fractions of the light emitted by said LEDs enter said first open ends.

14. The illuminating apparatus of claim 11, in which the dimensions of said light directing units are selected so that, when said reader is located at a typical distance from the bar code symbol to be read, said bar code symbol falls within said field of view.

15. The illuminating apparatus of claim 11, in which said light director member has a molded one-piece construction.

16. The illuminating claim 11, in which said surfaces each include a plurality of surface segments having different angular orientations with respect to optical axes of corresponding LEDs.

17. The illuminating apparatus of claim 16, in which at least one of the surface segments of each of said surfaces has an angular orientation causing said at least one surface segment to receive light rays that are formed at angles from about 39 to about 60 with respect to the optical axes of the corresponding LEDs.

18. The illuminating apparatus of claim 16, in which at least one of the surface segments of each of said surfaces has an approximately conical shape.

19. The illuminating apparatus of claim 16, in which at least one of the surface segments of each of said surfaces includes a plurality of approximately planar component segments.

20. The illuminating apparatus of claim 11, wherein the intensity of light impinging on an outer portion of said two-dimensional field of view from said light director units is greater than the intensity of light impinging on an inner portion of said field of view when said director is placed the predetermined distance from said field of view.

* * * * *